United States Patent [19]
Schuster

[11] Patent Number: 6,084,708
[45] Date of Patent: Jul. 4, 2000

[54] DOUBLE-REFRACTING PLANAR PLATE ARRANGEMENT AND DEEP ULTRAVIOLET λ/4-PLATE

[75] Inventor: Karl Heinz Schuster, Königsbronn, Germany

[73] Assignee: Carl-Zeiss-Stiftung, Heidenheim, Germany

[21] Appl. No.: 08/929,913

[22] Filed: Sep. 15, 1997

[30] Foreign Application Priority Data

Sep. 14, 1996 [DE] Germany .............. 196 37 563

[51] Int. Cl.[7] ................................................ G02B 5/30
[52] U.S. Cl. ...................... 359/494; 359/500; 359/352
[58] Field of Search .................. 359/494, 495, 359/500, 352

[56] References Cited

U.S. PATENT DOCUMENTS

| | | | |
|---|---|---|---|
| 2,313,349 | 3/1943 | Land | 359/485 |
| 2,823,491 | 2/1958 | Long | 359/500 |
| 3,957,375 | 5/1976 | Hadeishi | 356/316 |

FOREIGN PATENT DOCUMENTS

| | | | |
|---|---|---|---|
| 2211667 | 7/1974 | France . | |
| 620137 | 3/1949 | United Kingdom | 359/494 |
| 1098897 | 1/1968 | United Kingdom . | |

OTHER PUBLICATIONS

"Simple process for building large homogeneous adaptable retarders made from polymeric materials" by F. Delplancke et al, Applied Optics, vol. 34, (1995) No. 16, pp. 2921 to 2926.

*Primary Examiner*—Jon Henry
*Attorney, Agent, or Firm*—Walter Ottensen

[57] ABSTRACT

The invention is directed to a double refracting planar plate arrangement and a λ/4 plate suitable for deep ultraviolet light. The λ/4 plate or the like is configured as a planar plate with stress-induced birefringence. The planar plate 1 is made of high quality quartz glass and is torsion-free and uniformly loaded in tension via suitable construction having several parallel tension devices (3, 7).

33 Claims, 1 Drawing Sheet

DOUBLE-REFRACTING PLANAR PLATE ARRANGEMENT AND DEEP ULTRAVIOLET λ/4-PLATE

FIELD OF THE INVENTION

The invention relates to a double-refracting planar plate arrangement with stress-induced birefringence and a λ/4-plate suitable for deep ultraviolet light.

BACKGROUND OF THE INVENTION

Phase delay plates can now be manufactured for the visible spectral range approximately up to a diameter of 300 mm with excellent retardation tolerance of ±5% for λ/4 and with an excellent optical throughput. For this purpose, stretched polyvinyl alcohol foil is cemented between optical plates. Unfortunately, these foils are not applicable for projection microlithography with deep ultraviolet light, for example of the wavelength 193 nm, because neither cement nor foil are stable under the radiation load.

The crystalline materials, which are double refracting and can be used, are $SiO_2$ and $MgF_2$. If λ/4 plates having a diameter of approximately 200 mm are needed, then it is very improbable to obtain suitable material for $SiO_2$. A retardation plate having a simple thickness is ideal. Here, the thickness is computed in accordance with the formula:

$$d = (k \cdot \lambda) : \Delta n.$$

The resulting plate thicknesses are almost the same for $SiO_2$ and $MgF_2$. For a quartz crystal, the difference of the index of refraction $\Delta n = 0.0135$ at 193 nm. In this way, a plate thickness of $d = 3.57 \,\mu m$ results. This is very low. Although quartz has an excellent wringing property (property which enables two surfaces to adhere when in contact due to molecular cohesion), at least a triple thickness should be sought in order to achieve a certain mechanical stability at 10 $\mu m$. This thickness is, however, not acceptable because of optical disturbance of the objective.

The Carl Zeiss Company of Oberkochen, Germany, has produced a λ/4 plate of quartz having a diameter of 150 mm and a thickness of approximately 16 $\mu m$ for a wavelength of 633 nm.

The actual problem resides in the availability of $SiO_2$ in the required size. Synthetic crystals achieve the size as plates; however, the crystal axis is perpendicular to the plane of the plate and not in the plate plane as required. The growth speeds in crystal growing are clearly different and are the slowest especially in the direction of the crystal axis. Synthetic pieces having a dimension in the direction of the crystal axis of greater than 100 mm are not known because of the reasons associated therewith.

Natural quartz crystals can, in individual cases, achieve the required size. In this way, no reliable production can be achieved because all known natural deposits are exhausted.

The alternative to quartz is synthetically produced $MgF_2$. However, here too problems are present in growing pieces of this size because $MgF_2$ has different thermal coefficients of expansion for the different directions in the crystal. Large crystals must be carefully thermally grown so that they do not burst. In this context, it is additionally difficult that $MgF_2$ cannot be wrung. Accordingly, cement must be used during processing. Later, a plate having a thickness of only a few micrometers must be held in optical contact between two quartz glass plates with an immersion medium.

The simple plate thickness for $MgF_2$ is 3.54 $\mu m$ or $\Delta n = 0.0136$ of $MgF_2$ at 193 nm.

The optical phase retardation can also be achieved by pressing or stretching a material which is at first isotropic. In this way, stress-induced birefringence is generated. Only materials transparent for deep ultraviolet light (especially for 193 nm) available in the required diameter, are suitable. Quartz glass can also be utilized because the radiation load is reduced as a consequence of the large diameter.

The question as to whether compression or tension is to be used is answered in favor of tension. With compression, the plates can bend which makes them fully unusable in a projection objective. With tension, the planarity and therefore the optical passthrough is improved.

SUMMARY OF THE INVENTION

It is an object of the invention to provide an arrangement having a thin planar plate of considerable dimensions which exhibits a stress-induced birefringence. It is a further object of the invention to provide such a planar plate which can be used as a DUV-λ/4 plate for microlithographic projection exposure apparatus. For this purpose, a large area homogeneous tension is to be realized in the planar plate.

The double-refracting planar plate arrangement of the invention has stress-induced birefringence and includes: a planar plate having first and second ends lying opposite each other; and, a first plurality and a second plurality of mutually parallel tension devices connected to the first and second ends, respectively, for applying first and second tension forces thereto.

With the mounting assembly, a large area DUV-suitable λ/4-plate having stress-induced birefringence is realized for the first time.

BRIEF DESCRIPTION OF THE DRAWINGS

The invention will now be described with reference to the drawings wherein.

DESCRIPTION OF THE PREFERRED EMBODIMENTS OF THE INVENTION

Figure 1:
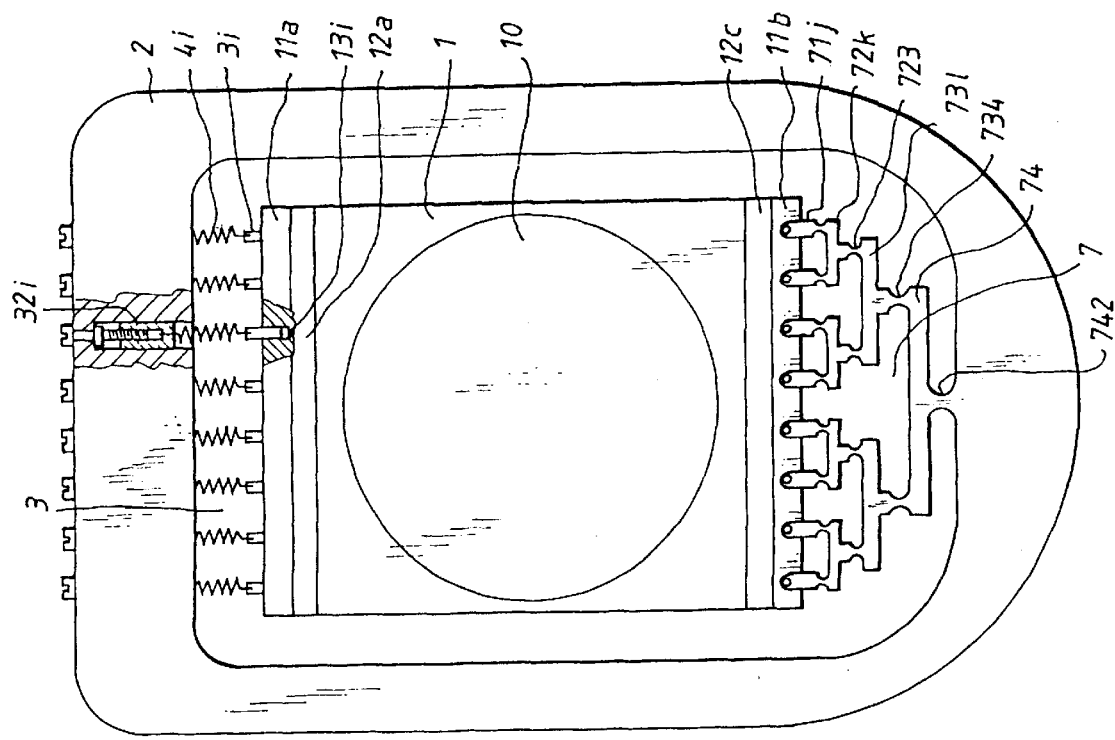
FIG. 1 is a schematic overall view of an embodiment of the planar plate assembly according to the invention; and, FIG. 2 is a detail view showing a form-locked force introduction into the planar plate.

The assembly of FIG. 1 shows the primary component in the form of a planar plate 1 made of quartz glass of high quality and ultraviolet durability. The planar plate 1 has dimensions which are typically 220×280×10 $mm^3$ (width× height×thickness). The planar plate 1 is irradiated by ultraviolet light in the circularly-shaped region 10 having a diameter of approximately 200 to 210 mm. The ultraviolet light is especially light of an excimer laser at a wavelength of less than 250 nm, for example, an ArF laser at 193 nm. The planar plate assembly is used, for example, in the projection objective of a microlithographic projection exposure apparatus. A need for the planar plate assembly of the invention is also present for catadioptric systems having beam splitter cubes, such as disclosed, for example, in U.S. Pat. No. 5,880,891 and in the publications cited therein.

The plane parallel plate 1 is fine-optically polished to define a planar surface and antireflective coatings are imparted thereto. Because of the stress-induced birefringence, this planar plate 1 defines a λ/4 plate with a tensile stress of 1.36 N/mm (2.72 N/mm for a plate thickness of 5 mm). This tensile stress must be introduced by the tension devices (3, 7) with high uniformity and without bending moments into the planar plate 1. In this way, the necessary effect can be uniformly and undisturbedly realized in the entire region 10.

The tension device 3 in the upper part and the tension device 7 in the lower part of FIG. 1 are examples as to how this uniform tensile stress can be introduced from the stiff tension frame 2 into the planar plate 1.

Two transverse members (of which only member 12a is shown) are provided between the usable region 10 and the rim region 11a and the transverse members (12c, 12d) are disposed between the usable region 10 and the rim region 11b. The transverse members (bars, beams) are made of the same quartz glass and have dimensions, for example, of 220×30×15 mm³ (width×height×thickness). The transverse members are wrung onto plate 1 or are cemented thereto. This stiffening effects a uniform distribution of the tensile stress of numerous but discrete rim points of the tension devices (3, 7) on the planar plate 1 in the region between the transverse elements (12a to 12d). This prevents the so-called curtain effect.

The upper tension device 3 has bores 12i in the planar plate 1 (for example, 5 mm diameter, 10 mm depth, 10 mm spacing). In these bores, pins 13i made of Invar are glued in utilizing cement which is resistant to ultraviolet light. Invar is compatible with quartz glass, especially with respect to thermal expansion. Alternatively, soldering is possible, for example, with a previous metallization of the quartz glass by vacuum coating or electrolysis. The ultraviolet light unavoidably reaches the anchors (12i, 13i) in small fractions because of scattering. To protect an adhesive against the aggressive ultraviolet light, soot can, for example, be mixed with the cement and function as an absorber.

The free ends 3i of the pins 13i include respective eyelets in which spiral tension springs 4i are hung. At the other end, each of these springs 4i is hooked into a longitudinally-adjustable bearing lug 32i. The bearing lugs 32i are tightly journalled in the holding frame 2. The uniform stress in the planar plate 1 is set by adjusting the longitudinally-adjustable bearing lugs 32i. For this purpose, the stresses in the quartz glass are interferometrically evaluated.

This tension device 3 can be arranged at both sides between the plane parallel plate 1 and the holding frame 2.

Figure 2:
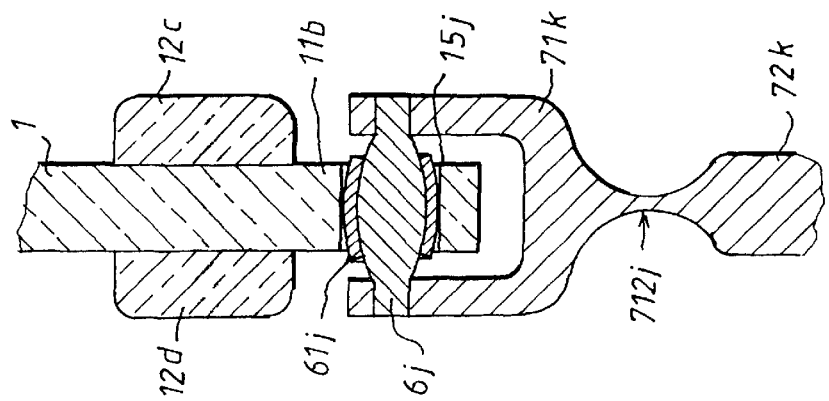

In the embodiment, another variation 7 of a tension device is shown at the lower end. The detail of FIG. 2 shows the form-tight torsion-free introduction of force into the planar plate 1. For this purpose, the planar plate 1 has a plurality of transverse bores 15j at equal spacings (for example, diameter 10 mm, spacing 10 mm).

When the bores 15j are produced, care must be taken so that they do not become frayed. For this reason, ancillary pieces are cemented above and below the drill location when drilling (that is, at both ends of the plate 1). In this way, unnecessary fissures are avoided which otherwise would reduce the reliability of the component. Only thereafter, the fine-optical processing of the planar surfaces takes place. Furthermore, it is advantageous to etch the parts in hydrofluoric acid in order to etch out fissures. Tempering also reduces the sensitivity to the formation of fissures.

Bolts 6j are formed with a bulge and can, for example, be made of hardened steel or Invar. These bolts 6j are inserted into the bores 15j. Preferably, a thin sleeve 61j made of a soft ductile material (such as copper or tin) is placed therebetween. In this way, a form-tight torsion-free connection of the planar plate 1 to the bolts 6j is obtained wherein excessive local loadings are avoided via the sleeves 61j.

The tension device 7 acts on these bolts 6j. First, the bolts 6j are taken up at both ends in a yoke 71k. The yoke 71k is connected via a spring joint 712j to a compensating member 72k. A compensating lever gearing is formed from the several parallel and in series connected compensating elements (72k, 731, 74). This lever gearing ensures a uniform tension loading of all bolts 6j. The spring joints (712j, 723, 734, 742) are configured so as to be soft against torsion and bending in the plane of the drawing of FIG. 1 and perpendicularly thereto so that no bending moment is transmitted to the planar plate 1. The tension device 7 is connected to the holding frame 2 via the spring joint 742. The compensating lever gearing in the form shown can be achieved with spark erosion, water jet cutting or laser machining. The number of bores 15j and therefore the lever and joints are, in practice, greater than shown in FIGS. 1 and 2. The bores number $10^1$ to $10^2$ (by order of magnitude).

In lieu of the spring joints shown, ball joints or multiple spring joint configurations can be used. For adjustment, the stiffness of the compensating elements (72k, 731, 74) and spring joints (723, 734, 742) can be changed in a specific manner by removing material, for example, using a laser.

This tension device can be provided at both ends and can also be combined with the tension springs or adhesive-attached pins of the tension device 3. Likewise, the springs of the tension device 3 can be attached via a yoke and bolt to the transverse bores of the planar plate 1.

In adhesive technology, a dove tail connection and especially a wedge dove tail can be provided as an alternative connection of the quartz plate to metal parts of the tension device. The metal part then is broken up into a plurality of elements movable relative to each other, preferably with spring joints. The form of the quartz glass part then considers adequately rounded portions in order to avoid forming notches in the brittle material.

Form-tight connections can also be configured as dovetail connections, with ridges (fins) arranged in the thickness direction or a pin running in the width direction. Wedges are also possible.

The metal parts are likewise configured as many parts in order to ensure good adaptation and uniform torsion-free tension loading.

All boundary surfaces between quartz glass and metal as well as between relatively-movable metal parts can be optimized with layers or inserts made of soft metal or PTFE for load distribution and friction reduction.

The stress distribution in the planar plate can deviate slightly from the homogeneity and can especially have a transverse profile provided the local tensile stress is correspondingly adjusted. In this way, for example, inhomogeneities of the polarization of the through-passing light beam caused, for example, by residual faults of the polarization divider cube in a catadioptric objective, can be compensated.

In addition to the tensile stress, pressure forces introduced transversely to the tensile stress can increase the stress-induced birefringence without the load limit of the quartz glass being exceeded. Because of the dominating tensile stress the rupture under pressure is avoided.

Deviations of the planar plate from the ideal form include the transverse contraction under tension which causes the effect of a cylinder lens and the meniscus-type deflection caused by gravity force when the lens is mounted horizontally. These deviations can be compensated by measures in manufacture with suitably bent surfaces. The deflection under the force of gravity can also be reduced via suitable bearings outside of the optically used cross section 10.

It is understood that the foregoing description is that of the preferred embodiments of the invention and that various changes and modifications may be made thereto without departing from the spirit and scope of the invention as defined in the appended claims.

What is claimed is:

1. A double-refracting planar plate arrangement having stress-induced birefringence, the arrangement comprising:

a planar glass plate having first and second ends lying opposite each other; and, a first plurality and a second plurality of mutually decoupled parallel tension devices connected to said first and second ends, respectively, for applying first and second tension forces thereto and for holding said planar glass plate under uniform tensile stress without imparting a compressive stress thereto.

2. A double-refracting planar plate arrangement having stress-induced birefringence, the arrangement comprising:

a planar plate having first and second ends lying opposite each other;

a first plurality and a second plurality of mutually parallel tension devices connected to said first and second ends, respectively, for applying first and second tension forces thereto;

said planar plate having an optically useable mid region between said first and second ends;

said first and second ends defining first and second coupling regions at which said first and second pluralities of tension devices apply tension forces; and, first and second pairs of transverse bars adherent to said planar plate between said mid region and said first and second coupling regions, respectively.

3. A double-refracting planar plate arrangement having stress-induced birefringence, the arrangement comprising:

a planar plate having first and second ends lying opposite each other;

a first plurality and a second plurality of mutually parallel-tension devices connected to said first and second ends, respectively, for applying first and second tension forces thereto; and, at least one of said tension devices including a tension spring.

4. The double-refracting planar plate arrangement of claim 1, further comprising at least one compensating lever in at least one of said first and second tension devices.

5. The double-refracting planar plate arrangement of claim 3, said tension devices being connected to said planar plate without cement.

6. The double-refracting planar plate arrangement of claim 2, said transverse bars being elongated members in wrung contact with said planar plate.

7. The double-refracting planar plate arrangement of claim 2, said optically usable mid region having a diameter greaser than 180 mm.

8. The double-refracting planar plate arrangement of claim 2, said planar plate having a thickness of approximately 5 to 15 mm.

9. The double-refracting planar plate arrangement of claim 4, each of said compensating lever devices being assembled with spring joints.

10. The double-refracting planar plate arrangement of claim 9, one of said compensating lever devices being configured as a single integral piece.

11. The double-refracting planar plate arrangement of claim 1, said planar plate being a $\lambda/4$-plate for an operating wavelength in the ultraviolet range.

12. The double-refracting planar plate arrangement of claim 1, said planar plate being made of glass.

13. The double-refracting planar plate arrangement of claim 12, said glass being quartz glass.

14. The double-refracting planar plate arrangement of claim 1, said planar plate being transparent and radiation stable in the deep ultraviolet range below 250 nm.

15. The double-refracting planar plate arrangement of claim 1, said planar plate being transparent and radiation stable in the deep ultraviolet range of 200 to 150 nm.

16. The double-refracting planar plate arrangement of claim 2, said planar plate being a $\lambda/4$-plate for an operating wavelength in the ultraviolet range.

17. The double-refracting planar plate arrangement of claim 2, said glass being quartz glass.

18. The double-refracting planar plate arrangement of claim 2, said planar plate being transparent and radiation stable in the deep ultraviolet range below 250 nm.

19. The double-refracting planar plate arrangement of claim 2, each of said tension devices including:

a plurality of mutually parallel bores formed in said end corresponding thereto so as to extend transversely through said planar plate at said end;

a plurality of bolts having a bulged cross section and engaging corresponding ones of said bores; a plurality of yokes for journalling corresponding ones of said bolts; and, a structure for holding said yokes in tension in said plane without torsion.

20. The double-refracting planar plate arrangement of claim 19, each of said bolts having a hard core and a plastically deformable sleeve.

21. The double-refracting planar plate arrangement of claim 19, said planar plate having an optically usable mid region between said first and second ends; and, said optically usable mid region having a diameter greater than 180 mm.

22. The double-refracting planar plate arrangement of claim 19, said planar plate having a thickness of approximately 5 to 15 mm.

23. The double-refracting planar plate arrangement of claim 2, wherein said first and second pairs of transverse bars are cemented to said planar plate to effect a uniform distribution of the tensile stress imparted by said tension devices.

24. The double-refracting planar plate arrangement of claim 2, wherein said first and second pairs of transverse bars are wrung to said planar plate to effect a uniform distribution of the tensile stress imparted by said tension devices.

25. The double-refracting planar plate arrangement of claim 1, each of said tension devices including: a plurality of mutually parallel bores formed in said end corresponding thereto so as to extend transversely through said planar plate at said end; a plurality of bolts having a bulged cross section and engaging corresponding ones of said bores; a plurality of yokes for journalling corresponding ones of said bolts; and, a structure for holding said yokes in tension in said plane without torsion.

26. The double-refracting planar plate arrangement of claim 25, each of said bolts having a hard core and a plastically deformable sleeve.

27. The double-refracting planar plate arrangement of claim 25, said planar plate having an optically usable mid region between said first and second ends; and, said optically usable mid region having a diameter greater than 180 mm.

28. The double-refracting planar plate arrangement of claim 25, said planar plate having a thickness of approximately 5 to 15 mm.

29. The double-refracting planar plate arrangement of claim 25, said planar plate being a $\lambda/4$-plate for an operating wavelength in the ultraviolet range.

30. The double-refracting planar plate arrangement of claim 25, said planar plate being made of glass.

31. The double refracting planar plate arrangement of claim 30, said glass being quartz glass.

32. The double-refracting planar plate arrangement of claim 25, said planar plate being transparent and radiation stable in the deep ultraviolet range below 250 nm.

33. The double-refracting planar plate arrangement of claim 25, said planar plate being transparent and radiation stable in the deep ultraviolet range of 200 to 150 nm.

* * * * *

UNITED STATES PATENT AND TRADEMARK OFFICE
CERTIFICATE OF CORRECTION

PATENT NO. : 6,084,708
DATED : July 4, 2000
INVENTOR(S) : Karl-Heinz Schuster

It is certified that error appears in the above-identified patent and that said Letters Patent is hereby corrected as shown below:

Title page,
Under "Attorney, Agent, or Firm", delete "Ottensen" and substitute -- Ottesen -- therefor.

Column 5,
Line 38, delete "parallel-" and substitute -- parallel -- therefor.
Line 55, delete "greaser" and substitute -- greater -- therefor.

Column 8,
Line 7, insert
-- 34. A transparent $\lambda/4$-plate for operating with deep ultraviolet light at a wavelength below 250 nm, the transparent $\lambda/4$-plate comprising:
    a planar plate made of glass; and,
    a structure for holding said planar plate under uniform tensile stress. --

Signed and Sealed this

Eighteenth Day of December, 2001

Attest:

*Attesting Officer*

JAMES E. ROGAN
*Director of the United States Patent and Trademark Office*